United States Patent [19]
Kazior et al.

[11] Patent Number: 5,343,071
[45] Date of Patent: Aug. 30, 1994

[54] SEMICONDUCTOR STRUCTURES HAVING DUAL SURFACE VIA HOLES

[75] Inventors: Thomas E. Kazior, Sudbury; John C. Huang, Cambridge, both of Mass.

[73] Assignee: Raytheon Company, Lexington, Mass.

[21] Appl. No.: 54,380

[22] Filed: Apr. 28, 1993

[51] Int. Cl.5 .......................................... H01L 29/06
[52] U.S. Cl. .................... 257/621; 257/624; 257/625
[58] Field of Search ............... 257/777, 778, 723, 724, 257/522, 513, 528, 619, 620, 621, 622, 623, 624, 625, 626, 627, 628

[56] References Cited

U.S. PATENT DOCUMENTS

| | | | |
|---|---|---|---|
| 3,577,037 | 5/1971 | DiPientro | 257/621 |
| 3,761,782 | 9/1973 | Youmans | 317/234 |
| 3,969,745 | 7/1976 | Blocker, III | 357/22 |
| 4,360,822 | 11/1982 | Roger | 257/621 |
| 4,456,888 | 6/1984 | Ayasli | 330/277 |
| 4,505,799 | 3/1985 | Baxter | 257/622 |
| 4,789,887 | 12/1988 | Crossley et al. | 257/621 |
| 4,951,099 | 8/1990 | Berenz et al. | 257/622 |
| 5,122,856 | 6/1992 | Komiya | 257/622 |

Primary Examiner—Rolf Hille
Assistant Examiner—S. V. Clark
Attorney, Agent, or Firm—Richard M. Sharkansky

[57] ABSTRACT

A semiconductor structure having an active layer formed over a first surface of a substrate. The semiconductor structure includes an electrode formed over a first surface of the structure. A conductive layer is formed over a second surface of the substrate. A conductor section passes through the semiconductor structure between the electrode and the conductive layer. The conductor section includes two conductive elements, one having a first end connected to the electrode and a second end terminating in the semiconductor structure; and the other conductive element having a first end connected to the conductive layer and a second end connected to the second end of the first conductive element. The second end terminates at, or in, an etch resistant layer disposed in the semiconductor structure between the active layer and the substrate. The method for forming the conductive sections includes etching the second via hole from the second surface of the substrate until the etching reaches an etch resistant layer. The walls of the second via hole and exposed portions of the conductive material covering the walls of the first via hole are covered with an electrically conductive material.

17 Claims, 5 Drawing Sheets

SEMICONDUCTOR STRUCTURES HAVING DUAL SURFACE VIA HOLES

BACKGROUND OF THE INVENTION

This invention relates generally to semiconductor structures and manufacturing methods and more particularly to electrical components adapted for monolithic microwave integrated circuit (MMIC) fabrication.

As is known in the art, it is frequently desirable to fabricate, and electrically interconnect, both passive and active microwave components on a common substrate. Such arrangement is commonly referred to as a monolithic microwave integrated circuit. Typically the components are electrically interconnected with microstrip transmission lines. The microstrip transmission lines include strip conductor circuitry disposed on one surface of the structure and separated from a ground plane conductor by a substrate. The active devices are typically, for example, heterojunction bipolar transistors (HBTs), or field effect transistors (FETs). A common substrate material used is gallium arsenide. Such substrate material is suitable for the passive microstrip transmission line circuitry, the support of passive devices, such as capacitors, and also for formation of single crystal epitaxial layers used to form the active semiconductor region for the HBTs and the FETs.

As is also known in the art, it is sometimes necessary to electrically connect one of the electrodes of the transistors, or one of the pair of electrodes of a capacitor, to the ground plane conductor. One technique used is to form a via hole which passes from a contact pad, or the electrode, being grounded, through both the epitaxial layer and the substrate, down to the underlying portion of the ground plane conductor. The walls of the via hole are covered with a suitable electrical conductor. Because of the thickness of the substrates typically used, however, the surface area of the contact pad must be relatively large. This large pad places limitations on device topology and also increases the capacitance of the circuit with a concomitant reduction in gain.

As is further known in the art, many active devices are formed with interdigitated electrodes. For example, transistors adapted to operate at high frequencies are sometimes formed with finger shaped gate electrodes (or base electrodes) and finger shaped drain electrodes (or collector electrodes). The finger shaped electrodes are disposed in an interdigitated relationship over a surface of a semiconductor body. Source electrodes (or emitter electrodes) are disposed over the surface and are positioned between a pair of the gate electrodes (or base electrodes). The gate electrodes (or base electrodes) are electrically connected, at proximal ends thereof, to a bus disposed on the surface of the semiconductor. Likewise, the drain electrodes (or collector electrodes) are electrically connected, at proximal ends thereof, to a bus disposed on the surface of the semiconductor body. In a FET, for example, there are two techniques used to connect the source electrodes: the first technique uses bridging conductors, sometimes referred to as air-bridges, which have ends connected to a pair of the source electrodes and which span over gate and drain electrodes; the second uses conductors which pass through vias formed through the semiconductor body beneath the source electrodes, the conductors then being electrically connected with a conductor formed over the bottom surface of the semiconductor body. The former technique is described in U.S. Pat. No. 4,456,888, issued Jun. 26, 1984 and the latter technique is discussed in U.S. Pat. No. 3,969,745, issued Jul. 13, 1976.

The air bridge technique results in increased capacitance between the drain and source electrodes ($C_{ds}$) and increased inductance ($L_s$) in the source electrode circuit. Air bridges, depending on how they are formed, may also prevent visual inspection of device channels and gate electrodes of completed chips. When used with semiconductor bodies having thicknesses of one hundred micrometers, the via connection technique, on the other hand, requires relatively large pads. Large pads, as noted above, contribute to reduced gain and place limitations on device topology.

SUMMARY OP THE INVENTION

In accordance with the present invention a semiconductor structure is provided having an electrically conductive layer disposed over one surface of the structure and an electrode disposed over an opposite surface of the structure. The electrode is electrically connected to the conductive layer by a conductor section. The conductor section passes through the semiconductor structure between the electrode and the conductive layer. The conductor section includes two conductive elements: a first conductive element having a first end connected to the electrode and a second end terminated in the semiconductor structure; and a second conductive element having a first end disposed on the conductive layer and another end connected to the second end of the first conductive element. With such structure the surface area of the electrode is reduced.

In a preferred embodiment of the invention, an etch resistant layer is provided in the semiconductor structure between the electrode and the electrically conductive layer. The second end of the second conductive element is terminated at, or in the etch resistant layer.

In accordance with an additional feature of the invention a method of fabricating a semiconductor structure is provided. A first via hole is formed through a first surface of the semiconductor structure into a region of the structure. A conductive material is deposited into the first via hole, a surface of the first via hole being covered with the conductive material. A second via hole, aligned with the first via hole, is then etched through an opposite surface of the semiconductor structure into the region of the structure. A conductive material is deposited over a second surface of the structure and into the second via hole. A portion of the material is deposited onto the surface of the second via hole and onto exposed portions of the conductive material deposited into the first via hole.

In a preferred embodiment, prior to forming the first and second via holes, an etch resistant layer is formed in the semiconductor structure between the first and second surfaces. The second via hole is etched from the second surface of the structure to the etch resistant layer. The use of the etch resistant layer allows for variations in substrate thickness and variations in etch rate without concern that an over-etching condition will result in the second via hole penetrating into the active layer.

BRIEF DESCRIPTION OF THE DRAWINGS

For a more complete understanding of the concepts of the invention reference is now made to the following description taken in connection with the accompanying drawings, in which.

DESCRIPTION OF THE PREFERRED EMBODIMENTS

Figure 1:
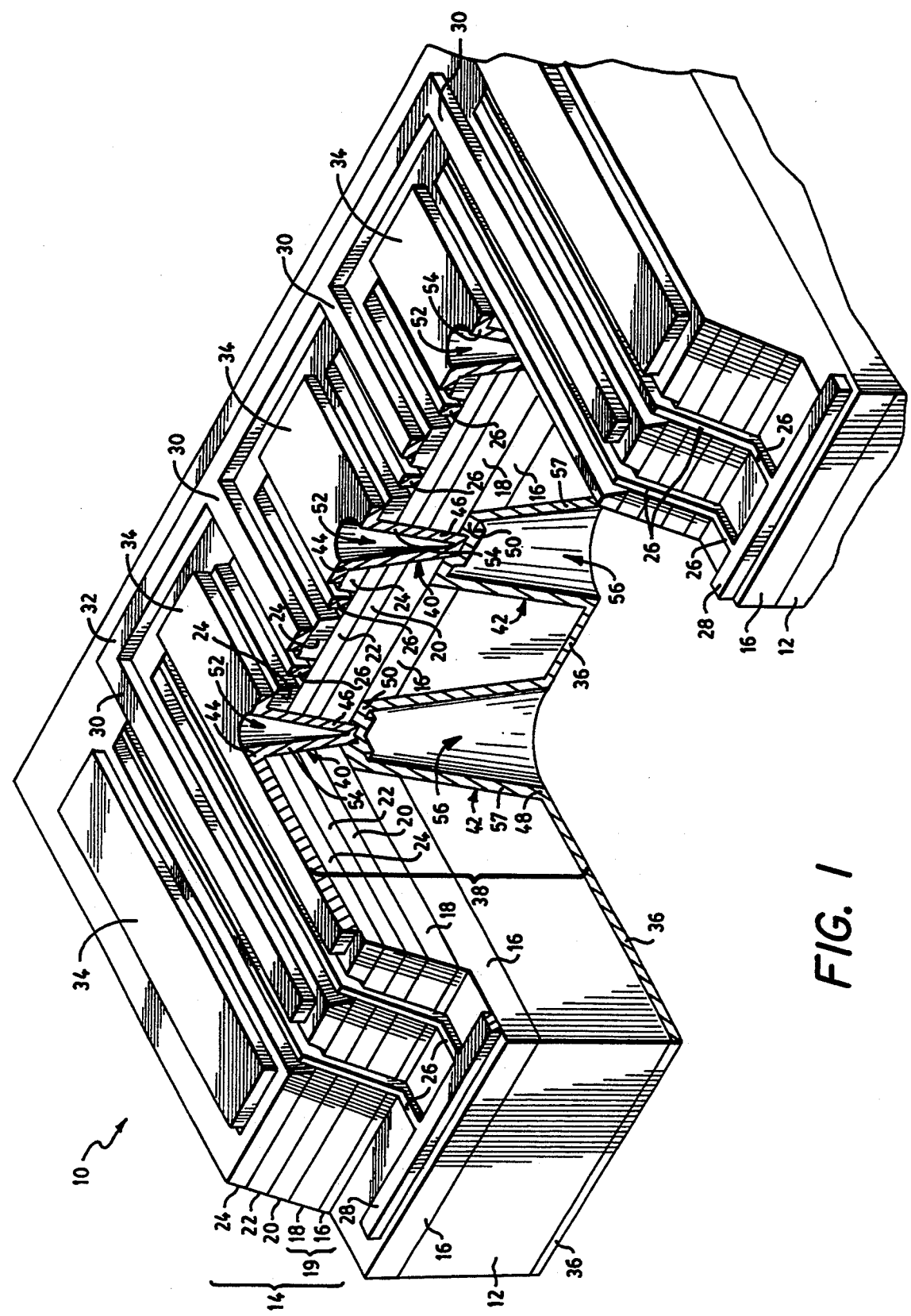
FIG. 1 is an isometric view, partially broken away and somewhat out of proportion and simplified, of a semiconductor structure according to the invention.

A semiconductor structure 10 is shown, here a pseudomorphic High Electron Mobility Field Effect Transistor (pHEMT). Thus, the structure 10 includes a substrate 12, here a GaAs. Disposed over the top of the substrate 12 is a plurality of epitaxial layers 14, here an undoped, GaAs layer 16, a AlGas etch resistent layer 18, which together with the undoped GaAs layer 16 provide a buffer layer 19, an active (or channel) layer 20, a charge supply layer 22 and an ohmic contact layer 24. Here, the plurality of epitaxial layers 14 has a thickness of between 0.2 micrometers and 1.0 micrometers while the thickness of the substrate is here about 100 micrometers. Here the active layer 20 is InGaAs, the charge supply layer 22 is AlGas and the ohmic contact layer 24 is GaAs.

A plurality of finger shaped first electrodes, here recessed gate electrodes 26, is formed in Schottkey barrier contact with the charge supply layer 22. The plurality of gate electrodes 26 is electrically interconnected by a conductive bus 28 disposed over the top surface of the substrate 12. A plurality of finger shaped second electrodes, here drain electrodes 30, is arranged in an interdigitated relationship with the plurality of gate electrodes 26 and is in ohmic contact with the contact layer 24. The plurality of drain electrodes 30 is electrically interconnected by a conductive bus 32 disposed over the top surface of the structure 10. A plurality of third electrodes, here source electrodes 34, is disposed in ohmic contact with the contact layer 24. The plurality of source electrodes 34 is electrically connected to a conductive layer 36 disposed over a bottom surface of the semiconductor structure 10 through a corresponding plurality of conductor sections 38. The conductor sections 38 pass through the semiconductor structure 10 between the plurality of source electrodes 34 and the conductive layer 36. The conductive layer 36 provides a ground plane conductor. Each one of the conductor sections 38 includes two conductive elements 40, 42: a first conductive element 40 has a first end 44 connected to, here integrally formed with, a corresponding one of the plurality of source electrodes 34 and one end 46 terminating in the semiconductor structure 12; and a second conductive element 42 has a first end 48 connected to, here integrally formed with, the conductive layer 36 and a second end 50 connected to the second end 46 of the first conductive element 40. The second end 50 of the second conductive element 42 terminates at, or slightly in, the etch resistant layer 18. Thus, the gate electrodes 26 are adapted to control, in a conventional manner, the flow of carriers passing through the channel layer 20 between the plurality of source electrodes 34 and the plurality of drain electrodes 30. Prior to forming the drain, gate and source electrodes 30, 26, 34, respectively, and the conductive layer 36, (and as will be described in detail in connection with FIGS. 2 to 8) a plurality of first via holes 52 is etched through the plurality of epitaxial layers 14 into an interior region of the substrate 12. The surfaces of the plurality of first via holes 52 are covered with an electrically conductive material 54 to form the first conductive elements 40 of the plurality of conductive sections 38. A plurality of second via holes 56 is then etched through a bottom surface of the substrate 12 into the aforesaid interior region of the substrate 12. Because of the etchant used, the etch rate of the material of substrate 12 is about one thousand times higher than the etch rate of the material of the etch resistant layer 18, the bottoms of the second plurality of via holes 56 generally terminate at, or slightly in, the etch resistant layer 18. The surfaces of the second via holes 56, and exposed portions of the electrically conductive material 40 covering the surfaces of the plurality of first vias 52, are covered with electrically conductive material 57. Further, as will become clear hereinafter, the electrically conductive material 54 is also used to form the source electrodes 34, the drain electrodes 30 and the bus 32. The electrically conductive material 57 is also used to form the conductive layer 36.

Figure 2:
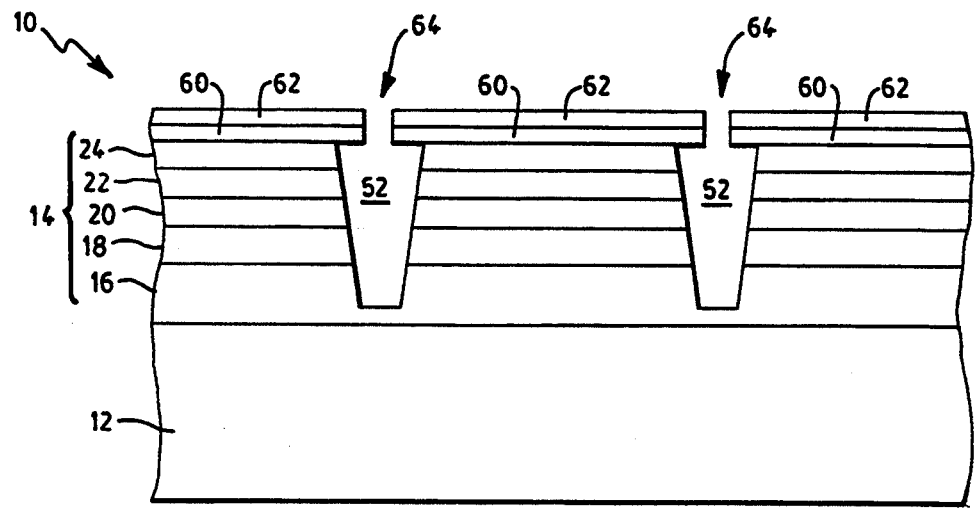
FIGS. 2 through 8 are schematic cross-sectional elevation views of a semiconductor structure according to the invention at various steps in the manufacture thereof.

More particularly, referring now to FIG. 2 the substrate 12 is provided. While, as noted above in connection with FIG. 1, such substrate 12 has a thickness of about 100 micrometers, the initial thickness of the substrate shown in FIG. 2 is here 25 thousandths of an inch. The plurality of epitaxial layers 14, are formed over the upper surface of the substrate 12. Next a layer of photoresist material 60 is spun onto the surface of the ohmic contact layer 24 in a conventional manner. Here the photoresist layer has a thickness of two micrometers. A mask 62 is positioned over the photoresist layer 60. The mask 62 has apertures 64 formed therein. Here the diameter of each aperture 64 is here on the order of 5 to 20 micrometers, here 15 micrometers. It is noted that the aperture 64 may be either square or round. A corresponding plurality of apertures is formed in the photoresist layer 60 using conventional photolithographic processing. The mask 62 is removed. The apertures, here also 15 micrometers, formed in the photoresist layer 60 thereby expose surface portions of the plurality of epitaxial layers 14. A conventional wet chemical or plasma etching process is used to etch into the exposed surface portion. The etching process continues into an interior region of the substrate 12 until the etch penetrates through the etch resistant layer 18, as shown. Thus, the plurality of first via holes 52 is formed through the epitaxial layers 14. The photoresist layer 60 is then removed.

Figure 3:
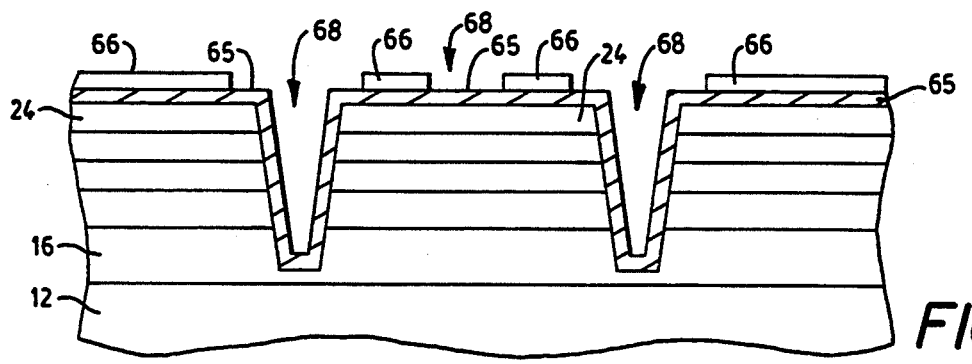

Referring now to FIG. 3, a photoresist layer 65 is spun onto the upper surface of the structure 10. Again, the thickness of the photoresist layer 65 is here two micrometers. A mask 66 is positioned over the photoresist layer 65. The mask 66 has apertures 68 formed therein to expose portions of the photoresist layer 65 where conductive material 54 (FIG. 1) is to be formed. More particularly, referring also to FIG. 1, the apertures 68 are formed in the mask 66 where the conductive material 54 is to provide the source electrodes 34, the first conductive elements 40, the drain electrodes 30 and the drain bus 32. The photoresist layer 65 is photolithographically processed in a conventional manner so that only those portions of the photoresist layer not exposed by the apertures 68 remain as shown in FIG. 4.

Figure 4:
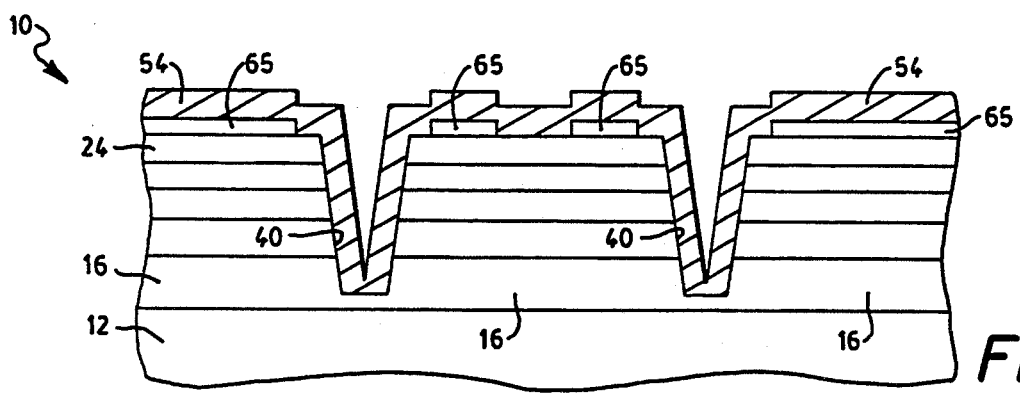
Figure 5:
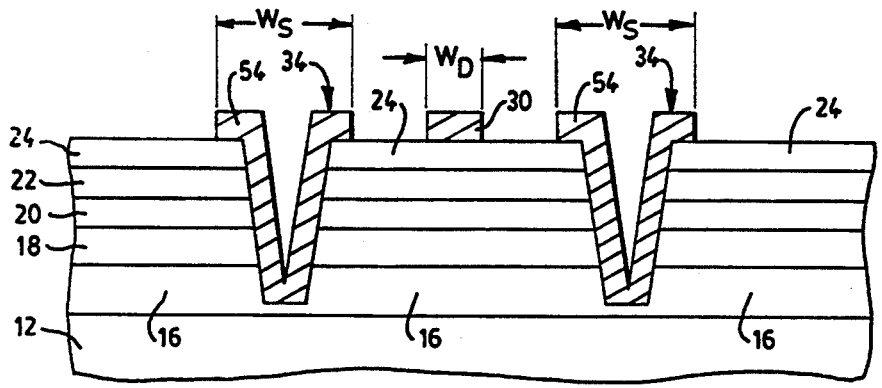

The upper surface of the structure 10, as shown in FIG. 4, is then exposed to a conventional metallization process to form a composite metallization layer, here the conductive material 54 for the first conductive element 40 referred to above in connection with FIG. 1. More specifically, here a sequence of Ni, AuGe, and Au (or a sequence of Pd, Ge, and Au) is evaporated over the remaining portions of the photoresist layer, onto exposed portions of the ohmic contact layer 24, over the side wall portion of the first via holes 52 (FIG. 1), and over the bottom of the first via holes 52, as shown in FIG. 4. The thickness of the conductive material 54 is here 0.5 micrometers. The photoresist layer, 65 with the portions of the conductive material 54 deposited over such layer 65, are washed away with a suitable solvent, here acetone, in a conventional manner to pattern the conductive material 54 as shown in FIG. 5. The structure 10 is processed in a conventional manner to anneal and alloy the conductive material 54 and thereby form an ohmic contact between the conductive material 54 and the ohmic contact layer 24. Thus, the source electrodes 34 and drain electrodes 30 are formed as shown in FIGS. 1 and 5. The width, $W_s$, of each one of the source pads, or electrodes 34 is here less than, or equal to thirty micrometers. The width, $W_D$, of each one of the drain pads, or electrodes 30 is here thirty to fifty micrometers.

Figure 6:
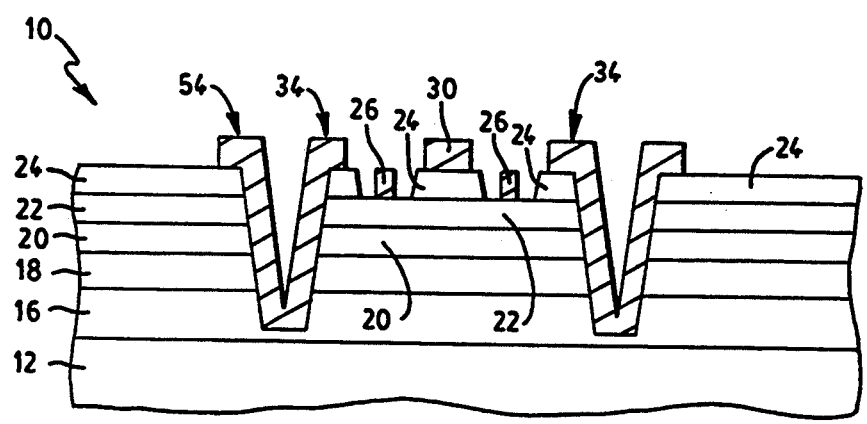

Referring now to FIG. 6, the structure 10 is processed in a conventional manner to form the recessed gate electrodes 26 in Schottkey contact with the charge supply layer 22. Next the structure 10, or wafer, is mounted onto a carrier, not shown. The mounted structure 10 is then thinned in a conventional manner by removing bottom portions of the substrate 12. Here, as noted above, the structure is thinned to 100 micrometers.

Figure 7:
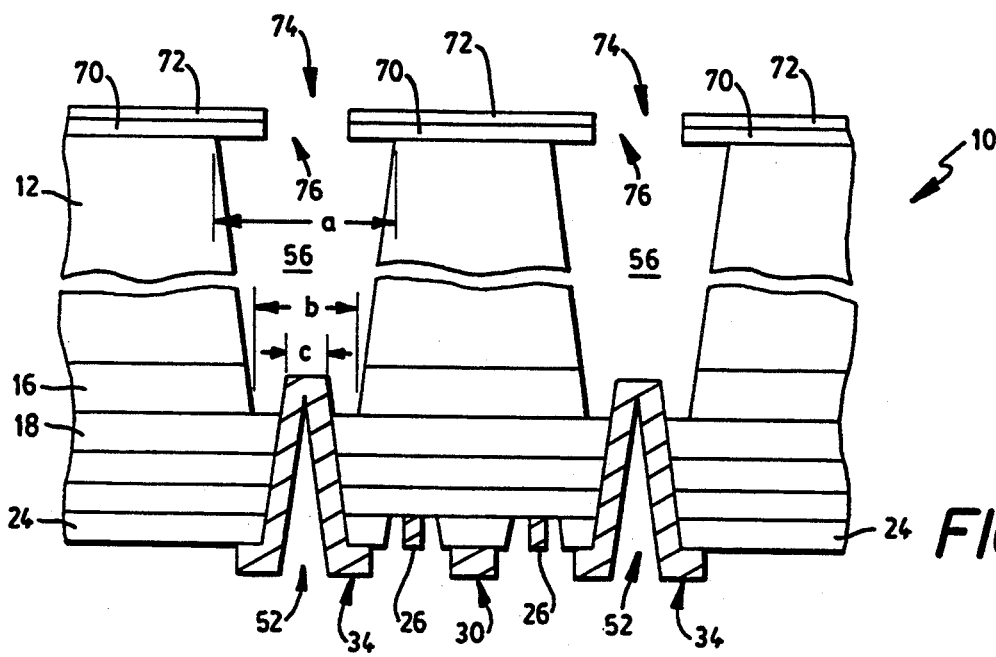

Referring now to FIG. 7, it is first noted that the wafer is shown turned "up side down". A photoresist layer 70 is spun over the bottom surface of the substrate 12 to a thickness of 7-10 micrometers. A mask 72 is positioned over the photoresist layer 70. The mask 72 has apertures 74 formed therein. Here the diameter of each one of the apertures 74 is on the order of 50 micrometers. The center of the apertures 74 is aligned with the centers of the first via holes 52. The alignment is accomplished using a conventional infrared mask aligner to "see" through the thinned GaAs wafer. The photoresist layer 70 is photolithographically processed in a conventional manner to form a plurality of apertures 76 in photoresist layer 70, each one also having a diameter of fifty micrometers. The mask 72 is removed. The portions of the bottom surface of substrate 12 exposed by the apertures 76 formed in the photoresist layer 70 are exposed to a plasma etch, here $BCl_3/Cl_2/SF_6$ or $CCl_2F_2$. As noted above, the etch rate of GaAs to such plasma etchant is about one thousand times faster than the etch rate of AlGaAs etch resistant layer 18 to such etchant. The etching process continues until the bottoms of the second via holes 56 formed by the etchant contacts, or enters slightly into (i.e., terminates slightly in), the etch resistant layer 18. It is noted that here, after the etching is complete the diameter of each of the second via holes 56 at the bottom surface of the substrate 12 (i.e., the "a" dimension) is less than 100 micrometers, and the dimension of the diameter of each of the second via holes 56 at the bottom of the second via holes 56 (i.e., the "b" dimension) is less than sixty micrometers. (It should also be noted that the diameter of each of the via holes 52 at the bottoms thereof (i.e., the "c" dimension) is less than 15 micrometers. After etching the second via holes 56, the photoresist layer 70 is removed.

Figure 8:
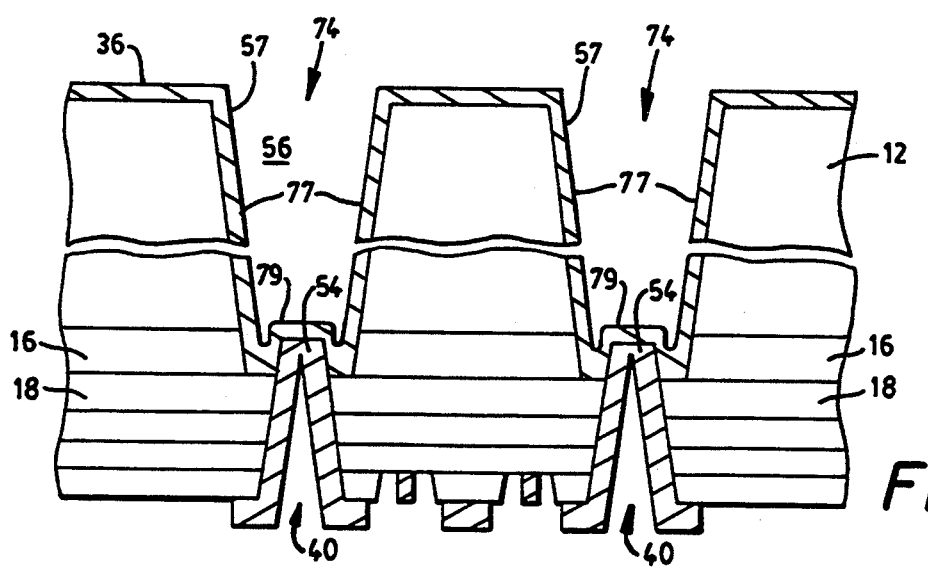

Referring now to FIG. 8, the conductive layer 36 (FIG. 1) is formed over the bottom surface of the substrate 12 and is deposited into the second via holes 56. Portions 77 of the conductive material 57 forming conductive layer 36 is deposited over the side walls and bottom walls of the second via holes 56 and other portions 79 are deposited onto exposed bottom portions of the conductive material 54 deposited into first via holes 52. Here the conductive layer 36 is formed by first sputter depositing a layer of Ti and then sputter depositing a layer of Au. The thickness of the layer of Au is increased by electroplating. The final thickness of the conductive layer 36 is here ten to fifteen micrometers.

Figure 9:
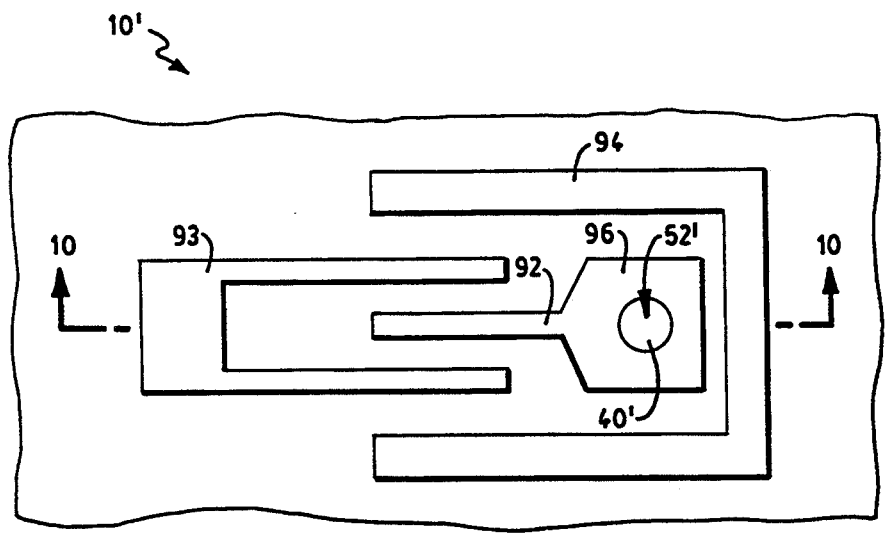
FIGS. 9 and 10 are schematic plan and cross-sectional elevation views of a semiconductor device according to an alternative embodiment of the invention, the cross-section elevation view of FIG. 10 being taken along line 10—10 of FIG. 9.
Figure 10:
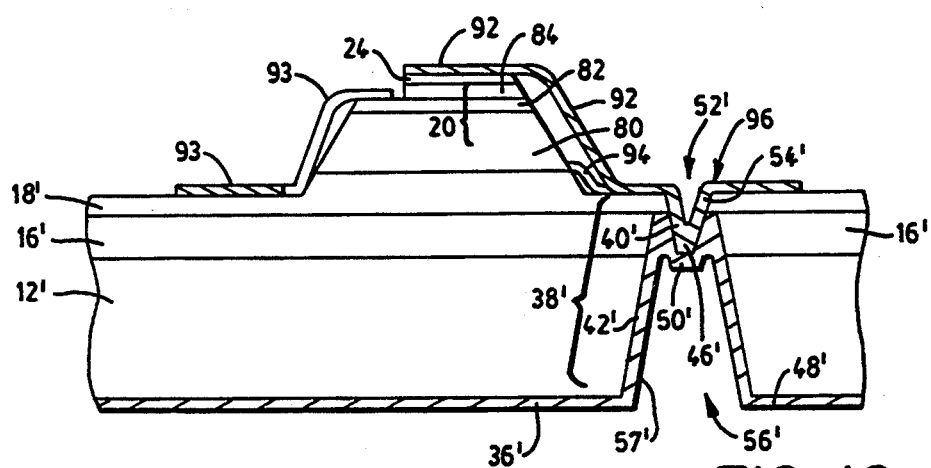

Referring to FIGS. 9 and 10, a semiconductor structure 10' is shown constructed to form a heterojunction bipolar transistor (HBT). (Here equivalent elements are indicated by a prime (') notation.) Thus a gallium arsenide substrate 12' has epitaxially formed undoped GaAs layer 16' and an etch resistant layer 18' formed sequentially over the upper surface of the substrate 12'. Thus, here an n-type conductivity epitaxially formed gallium arsenide collector layer 80, p-type conductivity epitaxially formed gallium arsenide base region or layer 82, and n-type conductivity epitaxially formed aluminum gallium arsenide (AlGaAs) emitter layer 84 are disposed sequentially over the upper surface of the etch resistant layer 18'. The base, emitter and collector together form the active layer 20' of the device. As shown in FIG. 10, an ohmic contact layer 24' is disposed over the emitter layer 84. Emitter, base and collector electrodes 92, 93, and 94, respectively are formed on the upper surface of the structure 10'. The base electrode 93 controls the flow of carriers passing through the active layer 20' (i.e. between the emitter electrode 92 and the collector electrode 94). An emitter pad 96 is connected to a conductive layer 36' (ground plane conductor) by a conductive section 38'. Conductor section 38' passes through the semiconductor structure between the emitter contact pad 96 and the ground plane conductor conductive layer 36'. The conductor section 38' includes two conductive elements 40', 42': a first conductive element 40' has a first end connected to (i.e. here integrally formed with) the emitter contact pad 96 and a second end 46' terminating in the semiconductor structure 12'; and a second conductive element 42' has a first end 48' connected to (here integrally formed with) the ground plane conductor conductive layer 36' and another end 50' connected to, disposed on, the second end of the first conductive element 40'. The etch resistant layer 18' is disposed in the semiconductor structure 10' between the active layer 20' and the substrate 12'. The second end of the second conductive element 42' terminates at, or slightly in, the etch resistant layer 18'. Again, the HBT is fabricated by: forming the active layer 20' over a first surface of the substrate 12'; etching a first via hole 52' through the etch resistant layer 18' into a region of the substrate 12'; depositing an electrically conductive material 54' into the first via hole 52', a portion of the conductive material 54' covering the surface of the first via hole 52'; etching a second via hole 56', in registration with the first via hole 52', through a second surface of the semiconductor structure 10' at, or slightly into, the etch resistant layer 18' region of the substrate 12'; and depositing an electrically conductive material 57' into the second via hole 56', a portion of the electrical conductive material 57' covering the surface of the second via hole 56', and exposed portions of the electrically conductive material 54' being deposited into the first via hole 52'.

Figure 11:
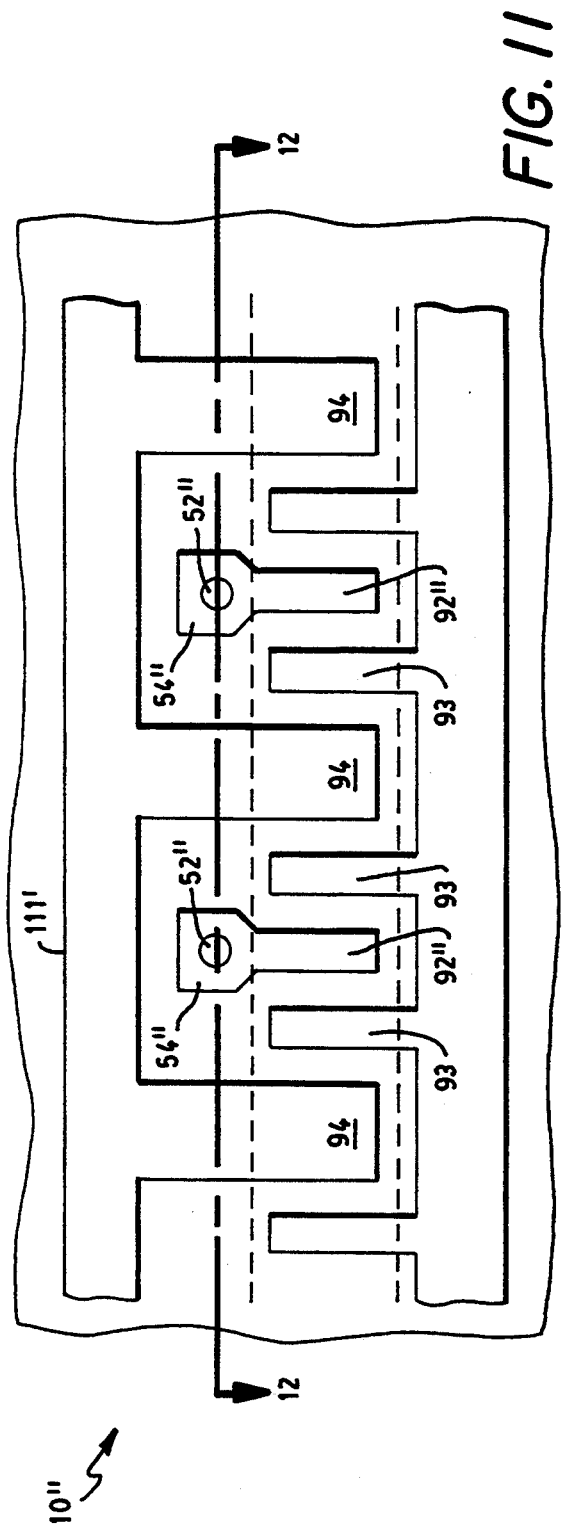
FIGS. 11 and 12 are schematic plan and cross-sectional elevation views of a semiconductor device according to another alternative embodiment of the invention, the cross-section elevation view of FIG. 12 being taken along line 12—12 of FIG. 11.
Figure 12:
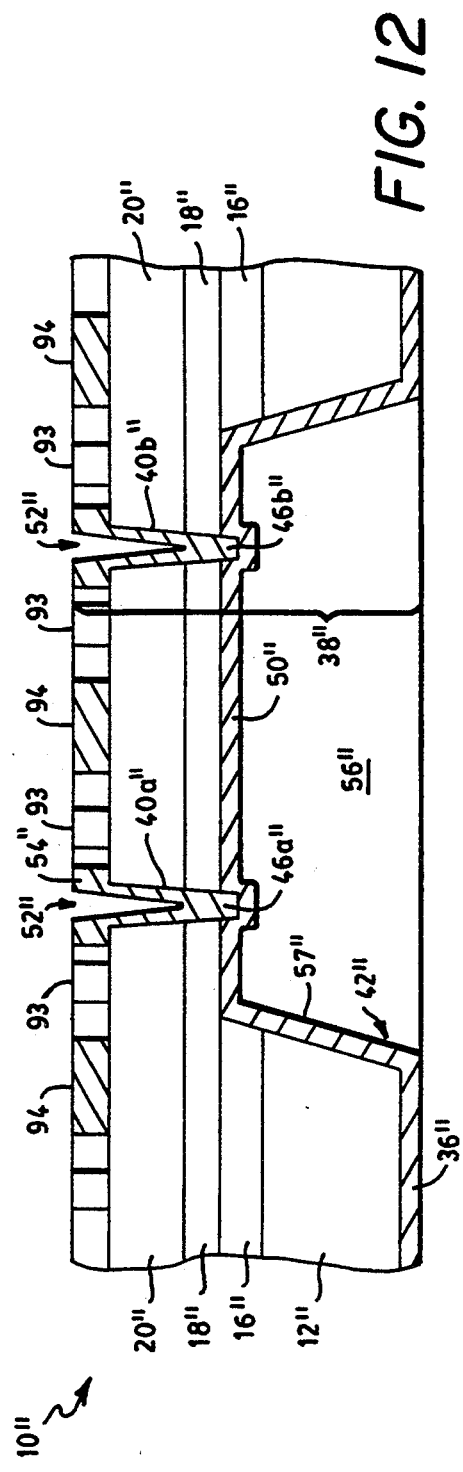

Referring to FIGS. 11 and 12 a semiconductor structure 10″ is shown. Here structure 10″ is formed as a multi-emitter HBT. (Like numerals are used, here with a double prime (″) superscript notation to identify elements equivalent to those used in connection with FIGS. 9 and 10). The conductor section 38″ includes a plurality of, here a pair of, conductive first elements 40″a, 40″b, and a single second conductive element 42″. The first ends of the first pair of conductive elements 40″a, 40″b are connected to a corresponding pair of emitter contact pads, or electrodes, 92″, and the second ends of the pair of first conductors 40″a, 40″b terminate in the semiconductor structure. The single second conductive element 42″ has a first end connected to the ground plane conductor conductive layer 36″ and another end 50″ disposed on the second ends 46″a, 46″b of the pair of first conductive elements 40″a, 40″b, as shown. The etch resistant layer 18″ is disposed in the semiconductor structure between the active layer 20″ and the substrate 12″. The second end 50″ of the second conductive element 42″ terminates at, or slightly in, the etch resistant layer 18″.

Thus, the structure 10″ is formed by etching the pair of first via hole 52″ through a first surface of the semiconductor structure into a region of the structure. The electrically conductive material 54″ is deposited into the pair of first via holes 52″ with surfaces of the pair of first via holes 52″ being covered with the conductive material 54″. The single second via hole 56″ is aligned with the pair of first via holes 52″, and is etched through an opposite surface of the semiconductor structure into the region of the structure. An electrically conductive material 57″ is deposited over a second surface of the structure and into the second via hole 56″. A portion of the electrically conductive material 57″ is deposited onto the surface of the second via hole 56″ and onto exposed portions of the electrically conductive material 54″ deposited into the pair of first via holes 52″.

Figure 13:
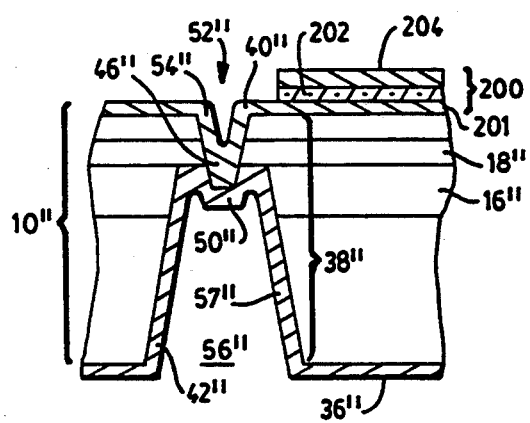
FIG. 13 is a cross section elevation view of a passive device in accordance with the invention.

Referring now to FIG. 13 a capacitor 200 is shown formed over the surface of structure 10″. A first via hole 52″ is formed through a first surface of the semiconductor structure 10″ into a region of the structure. (Here a double prime (″) notation is again used to indicate equivalent elements). An electrically conductive material 54″ is deposited into the first via hole 52″, a surface of the first via hole 52″ being covered with the conductive material 54″. A second via hole 56″, aligned with the first via hole 52″, is then etched through an opposite surface of the semiconductor structure into the region of the structure. An electrically conductive material 57″ is deposited over a second surface of the structure and into the second via hole 56″. A portion of the conductive material 57″ is deposited onto the surface of the second via hole 56″ and onto exposed portions of the conductive material 54″ deposited into the first via hole 52″. Prior to forming the first and second via holes 52″, 56″, an etch resistant layer 18″ is formed in the semiconductor structure between the first and second surfaces. The second via hole 56″ is etched from the second surface of the structure to the etch resistant layer 18″. The conductive material 54″ through the first via hole 52″ provides the lower electrode 201 of the capacitor 200. A dielectric layer 202, here silicon nitride, is disposed over the conductive material 54″. The upper electrode 204 for the capacitor 200 is formed over the dielectric layer 202. It is noted that the conductive material 57″ passing through the second via hole 56″ also provides a portion of a ground plane conductive layer 36″ for other active devices, not shown, or microstrip transmission lines, not shown, also formed integrally with the capacitor 200 as a monolithic microwave integrated circuit. Thus, a semiconductor structure is provided having an electrically conductive layer 36″ disposed over one surface of the structure 10″ and an electrode 201 disposed over an opposite surface of the structure. The electrode 201 is electrically connected to the conductive layer 36″ by a conductor section 38″. The conductor section 38″ passes through the semiconductor structure between the electrode 201 and the conductive layer 36″. The conductor section 38″ includes two conductive elements 40″, 42″: a first conductive element 40″ has a first end connected to the electrode 201 (here integrally formed with electrode 201), and a second end 46″ terminated in the semiconductor structure; and a second conductive element 42″ has a first end connected to the conductive layer 36″ and another end is connected to the second end 50″ of the first conductive element 40″. The etch resistant layer 18″ is provided in the semiconductor structure between the electrode 201 and the conductive layer 36″. The second end 50″ of the second conductive element 42″ is terminated at, or slightly in, the etch resistant layer 18″. It is noted that the capacitor 200 and the transistors described in connection with FIGS. 1–12 may be formed on the same substrate as part of a monolithic microwave integrated circuit.

Having described preferred embodiments of the invention it will now be apparent to one of skill in the art that other embodiments incorporating its concepts may be used. It is felt, therefore, that this invention should not be restricted to the preferred embodiments but rather should be limited only by the spirit and scope of the appended claims.

What is claimed is:

1. A semiconductor structure, comprising:
    an electrically conductive layer disposed over one surface of the structure;
    an electrode disposed over an opposite surface of the structure;
    a conductor section passing through the semiconductor structure between the electrode and the conductive layer, the conductor section comprising: a first metal conductive element having a first end connected to the electrode and a second end terminated in the semiconductor structure; and a second metal conductive element having a first end connected to the conductive layer and another end disposed on and connected to the second end of the first metal conductive element.

2. The semiconductor structure recited in claim 1 including an etch resistant layer disposed in the semiconductor structure between the electrode and the electrically conductive layer.

3. The semiconductor structure recited in claim 2 wherein the second end of the second metal conductive element is terminated at, or in, the etch resistant layer.

4. A semiconductor structure, comprising:
a substrate;
an active layer disposed over a first surface of the substrate;
first, second and third electrodes, one of the electrodes being adapted to control a flow of carriers passing through the active layer between the other two of the electrodes;
a conductive layer disposed over a second surface of the semiconductor body; and
a conductor section electrically connecting the conductive layer to a selected one of the electrodes, the conductor section passing through the semiconductor structure between the electrode and the conductive layer, the conductor section includes two conductive elements: a first metal conductive element having a first end connected to the electrode and a second end terminating in the semiconductor structure; and a second metal conductive element having a first end connected to the conductive layer and another end connected to and disposed on the second end of the first conductive element.

5. The semiconductor structure recited in claim 4 including an etch resistant layer disposed in the semiconductor structure between the active layer and the substrate.

6. The semiconductor structure recited in claim 5 wherein the second end of the second metal conductive element terminates at, or in, the etch resistant layer.

7. The structure recited in claim 6 wherein the first end of the second metal conductive element and the conductive layer are integral one with the other.

8. A semiconductor structure, comprising:
substrate;
an active layer disposed over a first surface of the substrate;
pluralities of first, second and third electrodes, the plurality of first electrodes being adapted to control a flow of carriers passing through the active layer between the plurality of second electrodes and the plurality of third electrodes, the first and second pluralities of electrodes being finger shaped and disposed over the active layer in an interdigitated relationship;
a conductive layer disposed over a second surface of the semiconductor body; and
a plurality of conductor sections electrically connecting the conductive layer to the plurality of third electrodes, the plurality of conductor sections passing through the semiconductor structure between the third plurality of electrodes and the conductive layer, each one of the conductor sections includes two conductive elements: a first conductive element having a first end connected to a corresponding one of the plurality of third electrodes and a second end terminating in the semiconductor structure; and a second conductive element having a first end connected to the conductive layer and another end connected to the second end of the first conductive element.

9. The semiconductor structure recited in claim 8 including an etch resistant layer disposed in the semiconductor structure between the active layer and the substrate.

10. The semiconductor structure recited in claim 9 wherein the second end of the second conductive element terminates at, or in, the etch resistant layer.

11. The structure recited in claim 9 wherein the first end of the second conductive element and the conductive layer are integral one with the other.

12. A semiconductor structure, comprising:
an electrically conductive layer disposed over one surface of the structure;
a plurality of electrodes disposed over an opposite surface of the structure;
a conductor section passing through the semiconductor structure between the electrodes and the conductive layer, the conductor section comprising: a first plurality of metal conductive elements, each one thereof having: a first end connected to a corresponding one of the plurality of electrodes; and a second end terminated in the semiconductor structure; and, a second metal conductive element having a first end connected to the conductive layer and another end disposed on the second ends of the first plurality of conductive elements; and
an etch resistant layer disposed in the semiconductor structure between the plurality of electrodes and the conductive layer.

13. A semiconductor structure, comprising:
an electrically conductive layer disposed over one surface of the structure;
an electrode disposed over an opposite surface of the structure;
a conductor section passing through the semiconductor structure between the electrode and the conductive layer, the conductor section comprising: a first conductive element passing through a first via hole in the structure and having a first end connected to the electrode and a second end terminated in the semiconductor structure; and a second conductive element passing through a second via hole in the structure and having a first end connected to the conductive layer and another end disposed on and connected to the second end of the first conductive element; and,
an etch resistant layer disposed in the semiconductor structure between the electrode and the electrically conductive layer.

14. A semiconductor structure, comprising:
substrate;
an active layer disposed over a first surface of the substrate;
first, second and third electrodes, one of the electrodes being adapted to control a flow of carriers passing through the active layer between the other two of the electrodes;
a conductive layer disposed over a second surface of the semiconductor body; and
a conductor section electrically connecting the conductive layer to a selected one of the electrodes, the conductor section passing through the semiconductor structure between the electrode and the conductive layer, the conductor section includes two conductive elements: a first conductive element passing through a first via hole and having a first end connected to the electrode and a second end terminating in the semiconductor structure; and a second conductive element passing through a second via hole and having a first end connected to the conductive layer and another end disposed on and connected to the second end of the first metal conductive element; and an etch resistant layer disposed in the semiconductor structure between the active layer and the substrate.

15. The semiconductor structure recited in claim 14 wherein the second end of the second metal conductive element terminates at, or in, the etch resistant layer.

16. The structure recited in claim 15 wherein the first end of the second metal conductive element and the conductive layer are integral one with the other.

17. A semiconductor structure, comprising:
a an electrically conductive layer disposed over one surface of the structure;
a plurality of electrodes disposed over an opposite surface of the structure;
a conductor section passing through the semiconductor structure between the electrodes and the conductive layer, the conductor section comprising: a first plurality of conductive elements, each one passing through a corresponding one of a first plurality of via holes and having: a first end connected to a corresponding one of the plurality of electrodes; and a second end terminated in the semiconductor structure; and, a second conductive element passing through a second via hole and having a first end connected to the conductive layer and another end disposed on the second end of the first plurality of conductive elements; and an etch resistant layer disposed in the semiconductor layer between the electrode and the electrically conductive layer.

* * * * *